(12) United States Patent
Asulin et al.

(10) Patent No.: US 11,646,173 B2
(45) Date of Patent: May 9, 2023

(54) SCANNING ELECTRON MICROSCOPE AND A METHOD FOR OVERLAY MONITORING

(71) Applicant: Applied Materials Israel Ltd., Rehovot (IL)

(72) Inventors: Itay Asulin, Rehovot (IL); Emil Weisz, Modiin (IL); Eitam Yitzchak Vinegrad, Rehovot (IL); Menachem Lapid, Hashmonaim (IL); Boris Rozensvaig, Ashdod (IL)

(73) Assignee: Applied Materials Israel Ltd., Rehovot (IL)

( * ) Notice: Subject to any disclaimer, the term of this patent is extended or adjusted under 35 U.S.C. 154(b) by 156 days.

(21) Appl. No.: 17/369,746

(22) Filed: Jul. 7, 2021

(65) Prior Publication Data
US 2021/0335569 A1    Oct. 28, 2021

Related U.S. Application Data

(63) Continuation of application No. PCT/US2019/068081, filed on Dec. 20, 2019.
(Continued)

(51) Int. Cl.
*H01J 37/244*    (2006.01)
*H01J 37/28*    (2006.01)

(52) U.S. Cl.
CPC ............ *H01J 37/244* (2013.01); *H01J 37/28* (2013.01); *H01J 2237/2443* (2013.01);
(Continued)

(58) Field of Classification Search
CPC .. H01J 37/244; H01J 37/28; H01J 2237/2443; H01J 2237/2445; H01J 2237/24475; H01J 2237/2448
See application file for complete search history.

(56) References Cited

U.S. PATENT DOCUMENTS 3,628,014 A * 12/1971 Grubic, Jr. ............. H01J 37/22
                                                                 348/34
6,897,442 B2 * 5/2005 Petrov ................... H01J 37/145
                                                                 250/397

(Continued)

FOREIGN PATENT DOCUMENTS

CZ          284 288 B6    10/1998
EP         2 487 704 B1    1/2014
(Continued)

OTHER PUBLICATIONS

International Preliminary Report on Patentability for Application No. PCT/US2019/068081, dated Jul. 22, 2021, 7 pages.
(Continued)

*Primary Examiner* — David A Vanore
(74) *Attorney, Agent, or Firm* — Kilpatrick Townsend & Stockton LLP (57) ABSTRACT

A scanning electron microscope and a method for evaluating a sample, the method may include (a) illuminating the sample with a primary electron beam, (b) directing secondary electrons emitted from the sample and propagated above a first scintillator, towards an upper portion of the first scintillator, wherein the first scintillator and a second scintillator are positioned between the sample and a column electrode of the column; wherein the first scintillator is positioned above the second scintillator; (c) detecting the secondary electrons by the first scintillator; (d) directing backscattered electrons emitted from the sample towards a lower portion of the second scintillator; and (e) detecting the backscattered electrons by the second scintillator.

20 Claims, 5 Drawing Sheets

Related U.S. Application Data (60) Provisional application No. 62/789,688, filed on Jan. 8, 2019.

(52) U.S. Cl.
CPC .............. *H01J 2237/2445* (2013.01); *H01J 2237/2448* (2013.01); *H01J 2237/24475* (2013.01)

(56) References Cited

U.S. PATENT DOCUMENTS

| | | | | |
|---|---|---|---|---|
| 10,859,718 | B1* | 12/2020 | Nagarkar | ................... G01T 1/29 |
| 2002/0088941 | A1* | 7/2002 | Yonezawa | ............. H01J 37/145 |
| | | | | 250/310 |
| 2010/0119698 | A1* | 5/2010 | Bihr | .................... H01J 37/3056 |
| | | | | 427/8 |
| 2013/0032713 | A1* | 2/2013 | Barbi | ................... G01T 1/2018 |
| | | | | 250/311 |
| 2016/0148782 | A1* | 5/2016 | Agemura | ................ H01J 37/28 |
| | | | | 250/310 |
| 2017/0004951 | A1* | 1/2017 | Weisz | ..................... H01J 37/18 |
| 2017/0271124 | A1* | 9/2017 | Sasaki | ................. H01J 37/1474 |
| 2019/0090335 | A1* | 3/2019 | Eytan | ........................ H05F 3/04 |
| 2021/0319976 | A1* | 10/2021 | Assulin | ................. H01J 37/244 |
| 2021/0335569 | A1* | 10/2021 | Asulin | ................... H01J 37/28 |
| 2022/0373857 | A1* | 11/2022 | Lapid | ..................... G02B 27/30 |

FOREIGN PATENT DOCUMENTS

| | | | |
|---|---|---|---|
| JP | 2011-249273 A | 12/2011 | |
| JP | 2013055073 A * | 3/2013 | ............ H01J 37/244 |
| PL | 217173 B1 | 6/2014 | |

OTHER PUBLICATIONS

International Search Report and Written Opinion for Application No. PCT/US2019/068081, dated Apr. 23, 2020, 10 pages.

Extended European Search Report for Application No. 19908595.2-1212/ 3909066 PCT/US2019068021, dated Oct. 12, 2022, 9 pages.

* cited by examiner

SCANNING ELECTRON MICROSCOPE AND A METHOD FOR OVERLAY MONITORING

This application is a continuation of International Application No. PCT/US2019/068081, filed Dec. 20, 2019, which claims priority to U.S. Provisional Application No. 62/789,688, filed Jan. 8, 2019, the entire contents of which are incorporated herein by reference for all purposes.

BACKGROUND

Various samples such as semiconductor wafers are manufactured by a highly complex and costly manufacturing process.

Overlay error may dramatically reduce the yield of the manufacturing process and may cause many objects to be regarded as defective.

There is a growing need to provide a system and method that may that may be cost effective, and be capable of generating an overlay image.

SUMMARY

There may be provided a scanning electron microscope (SEM) that may include a column that may be configured to illuminate a sample with a primary electron beam; a column electrode; a first scintillator; a second scintillator that may be positioned below the first scintillator; a high power supply system; wherein the first scintillator and the second scintillator may be positioned between the column electrode and the sample; wherein the high power supply system may be configured to bias the sample, the column electrode, the first scintillator and the second scintillator; wherein the first scintillator may be configured to detect secondary electrons that were emitted from the sample, propagated above the first scintillator and returned towards towards the first scintillator; and wherein the second scintillator may be configured to detect backscattered electrons that were emitted from the sample.

The first scintillator may be configured to emit light of a first color in response to the detection of the secondary electrons; and wherein the second scintillator may be configured to emit light of a second color that differs from the first color in response to the detection of the backscattered electrons.

The scanning electron microscope may include a light detector that may be coupled to the first and second scintillator via a single light guide.

The scanning electron microscope may include a first light detector that may be coupled to the first scintillator via a first light guide and a second light detector that may be coupled to the second scintillator via a second light guide.

The scanning electron microscope may include at least one light detector, at least one light guide that may be coupled between the first scintillator, the second scintillator and the at least one light detector, and an image processor that may be coupled to the at least one light detector.

The image processor may be configured to generate an overlay image based on the signals generated by the at least one light detector.

The first scintillator may include a first aperture, wherein the second scintillator may include a second aperture; wherein the column may be configured to direct the primary electron beam through the first aperture and through the second aperture; wherein the first scintillator may be configured to detect the secondary electrons that passed through the first aperture and through the second aperture.

The high power supply system may be configured to positively bias the sample, to positively bias the first scintillator and the second scintillator in relation to the sample, and to negatively bias the column electrode in relation to the first and second scintillator.

The high power supply system may be configured to positively bias the sample by a voltage that exceeds five (or ten) kilovolts, to bias the first scintillator and the second scintillator by a voltage that exceeds ten (or fifteen) kilovolts.

The distance between the column electrode and the first scintillator may be of a millimetric scale (between half a millimeter and 20 millimeters—for example between 2 and 3 millimeters) and wherein a distance between the second scintillator and the sample may be of a millimetric scale.

There may be provided a method for evaluating a sample, the method may include: illuminating the sample with a primary electron beam generated by a column of a scanning electron microscope; directing secondary electrons emitted from the sample and propagated above a first scintillator, towards an upper portion of the first scintillator, wherein the first scintillator and a second scintillator may be positioned between the sample and a column electrode of the column; wherein the first scintillator may be positioned above the second scintillator; detecting the secondary electrons by the first scintillator; directing backscattered electrons emitted from the sample towards a lower portion of the second scintillator; and detecting the backscattered electrons by the second scintillator.

The method may include emitting, by the first scintillator, light of a first color in response to the detecting of the secondary electrons; and emitting, by the second scintillator, light of a second color that differs from the first color in response to the detecting of the backscattered electrons.

The conveying the light of the first color and the light of the second color to a light detector over a single light guide.

The method may include conveying light emitted from the first scintillator to a first light detector over a first light guide; and conveying light emitted from the second scintillator to a second light detector over a second light guide.

The method may include conveying detection signals to an image processor; wherein the detection signals may be generated by at least one light detector that may be coupled by at least one light guide to the first scintillator and to the second scintillator.

The method may include generating, by the image processor. an overlay image based on the signals generated by the at least one light detector.

The illuminating may include directed the primary electron beam through a first aperture formed in the first scintillator, and through a second aperture formed in the second scintillator; and wherein the directing of the secondary electrons may include directing the secondary electrons through the first aperture through the second aperture.

The method may include (a) positively biasing, by a high power supply system, the sample, (b) positively biasing, by the high power supply system, the first scintillator and the second scintillator in relation to the sample, and (c) negatively biasing, by the high power supply system, the column electrode in relation to the first and second scintillator.

The method may include (a) positively biasing, by a high power supply system, the sample by a voltage that exceeds ten kilovolts, (b) biasing, by the high power supply system, the first scintillator and the second scintillator by a voltage that exceeds fifteen kilovolts.

The distance between the column electrode and the first scintillator may be of a millimetric scale and wherein a distance between the second scintillator and the sample may be of a millimetric scale.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions for executing the method.

Any reference in the specification to a system should be applied mutatis mutandis to a method that may be executed by the system and should be applied mutatis mutandis to a non-transitory computer readable medium that stores instructions executable by the system.

There is a growing need for generating overlay images that provide information about a top layer and a buried layer. The overlay image may be an overlay image of a region of the sample—especially a top layer of the region and a buried layer of the region. The top layer may have a thickness of below a millimeter or above a millimeter. The region may be of micron scale.

To achieve good performance, there are two basic requirements:
 a. Achieving a high landing energy beam (in order to penetrate the thickness of the top layer and reach the buried layer).
 b. Separating secondary electron information (sensitive to the top layer) from backscattered electrons information (sensitive to the buried layer) in order to allow accurate measurement of position.

Achieving the high landing energy beam may require to bias the emitter with a very high negative voltage (for example—above ten kilovolts) compared to the sample. This drastically increases the risk for high voltage arcing. Avoiding arcing is a major technical difficulty from the design and manufacturability aspects. Such a SEM will be very complex and expensive.

Alternately, a positive voltage may be applied to the sample—that in turn will reduce the required negative voltage on the emitter. Nevertheless—the biasing of the sample with a positive voltage causes the SEM column to behave as a mirror for secondary electrons (that have low energies) making it in turn impossible to detect the secondary electrons by an in-lens secondary electron detector. The in-lens means that the detector is located within the column.

Figure 1:
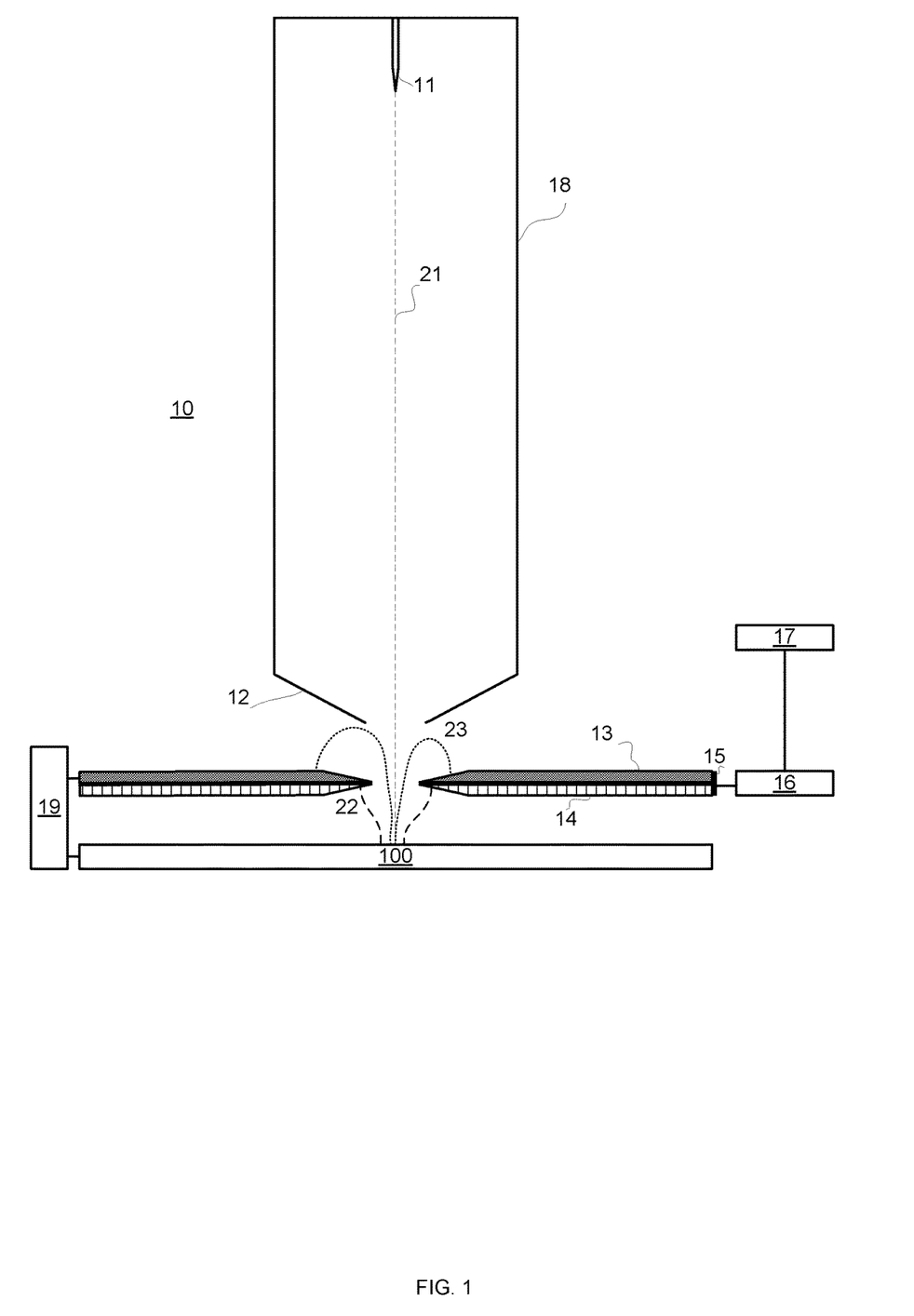
FIG. 1 illustrates an example of a part of a scanning electron microscope (SEM) and a sample.

FIG. 1 illustrates an example of a sample 100 and a scanning electron microscope (SEM) 10 that includes a column 18 that may be configured to illuminate the sample 100 with a primary electron beam 21, an electron source 11, a column electrode 12, a first scintillator 13, a second scintillator 14 that is positioned below the first scintillator, a high power supply system 19, a first light guide 15, a first light detector 16 and an image processor 17.

The first scintillator 13 and the second scintillator 14 are positioned between the column electrode 12 and the sample 100.

The high power supply system 19 may be configured to bias the sample 100, to bias the column electrode 12, to bias the first scintillator 13 and the second scintillator 14 and to bias the electron source.

The high power supply system 19 may be configured to (a) positively bias the sample (provide a positive bias voltage of one or more kilovolts—for example above ten kilovolts), (b) to positively bias the first scintillator and the second scintillator in relation to the sample (make the first scintillator and the second scintillator more positive than the sample)—for example supply one or more biasing signals to the first and second scintillators—for example above fifteen kilovolts, and (b) negatively bias the column electrode in relation to the first and second scintillator. The column electrode will be more negative than the first scintillator and more negative than the first scintillator. The column electrode may be biased with a negative voltage. The electron source 11 may be biased with even a more negative bias voltage.

The first scintillator and the second scintillator may be biased to the same voltage. Alternatively—the high power supply system may bias the first scintillator to a first bias voltage and may bias the second scintillator to a second bias voltage that may differ from the first bias voltage.

For example—the first scintillator can be biased by a bias voltage that is more positive compared to the bias voltage supplied to the second scintillator. The difference between the bias voltages may, for example, exceed few kilovolts. For example—the second scintillator can be biased to about one kilovolts compared to the sample and the first scintillator can be biased to about five kilovolts compared to the sample. This scheme gives the secondary electrons an additional horizontal velocity above the first scintillator and spreads the secondary electrons further off-axis resulting in bigger portion of angles hitting the first scintillator compared to the situation in which both scintillators are biased by the same bias voltage.

The biasing scheme and the position and the shape of the first scintillator and the second scintillator cause secondary electrons 23 emitted from the sample to pass through a second aperture formed in the second scintillator, pass through a first aperture formed in the first scintillator, continue propagating towards the column and finally return towards an upper portion of the first scintillator—and to be detected by the first scintillator.

A first scintillator positive voltage of a few kilovolts is required to sufficiently accelerate the secondary electrons so that the secondary electrons will hit the first scintillator with a few kV energy allowing sufficient signal generation by the first scintillator.

The biasing scheme and the position and the shape of the first scintillator and the scintillator cause backscattered electrons 22 emitted from the sample to propagate towards a lower portion of the second scintillator—and to be detected by the second scintillator.

FIG. 1 illustrates a first light guide 15 optically coupled between a first light detector 16 and the first scintillator and the second scintillator.

In order to allow the light detector to differentiate between light emitted from the first scintillator (due to the detection of secondary electrons) and between light emitted from the second scintillator (due to the detection of backscattered electrons)—the light emitted from the first scintillator is of a different color than the light emitted from the second scintillator.

Figure 3:
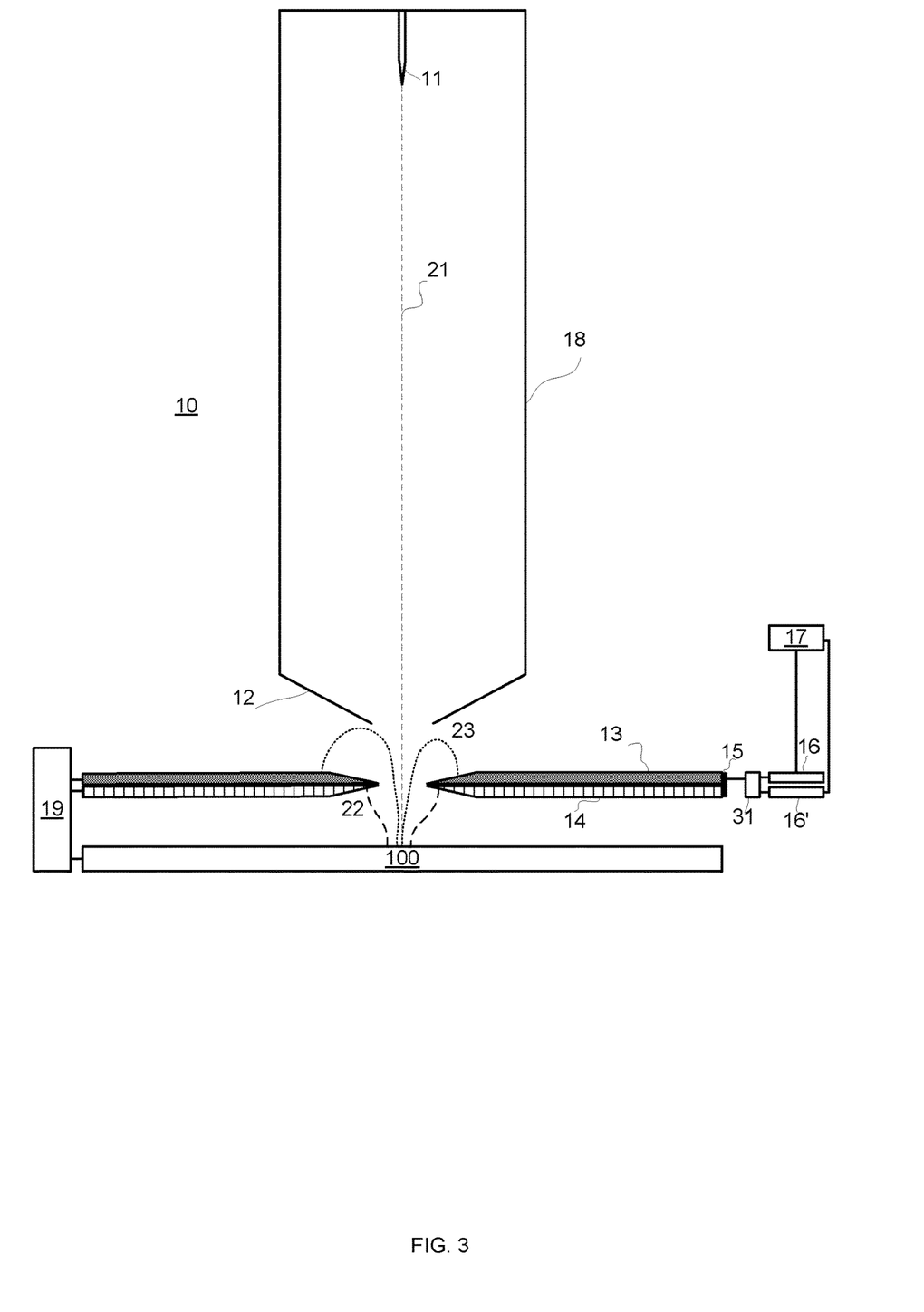
FIG. 3 illustrates an example of a part of a scanning electron microscope (SEM) and a sample.

The light emitted from the first scintillator and second scintillator is detected by the first light detector 16 that sends detection signals to image processor 17. The image processor 17 is configured to generate an overlay image that include information about the top layer (represented by the secondary electrons detected by the first scintillator) and about the buried layer (represented by the backscattered electrons detected by the second scintillator). Alternatively, as illustrated in FIG. 3, the light emitted from the first scintillator and the light emitted from the second scintillators (being of different colors) are separated from each other after the single light guide and are fed to two different detection channels (that include two light detectors) to provide separate secondary electron images and a separate backscattered electron image that may be overlaid to provide an overlay image. The separation can be implemented by spectral filtering.

Figure 2:
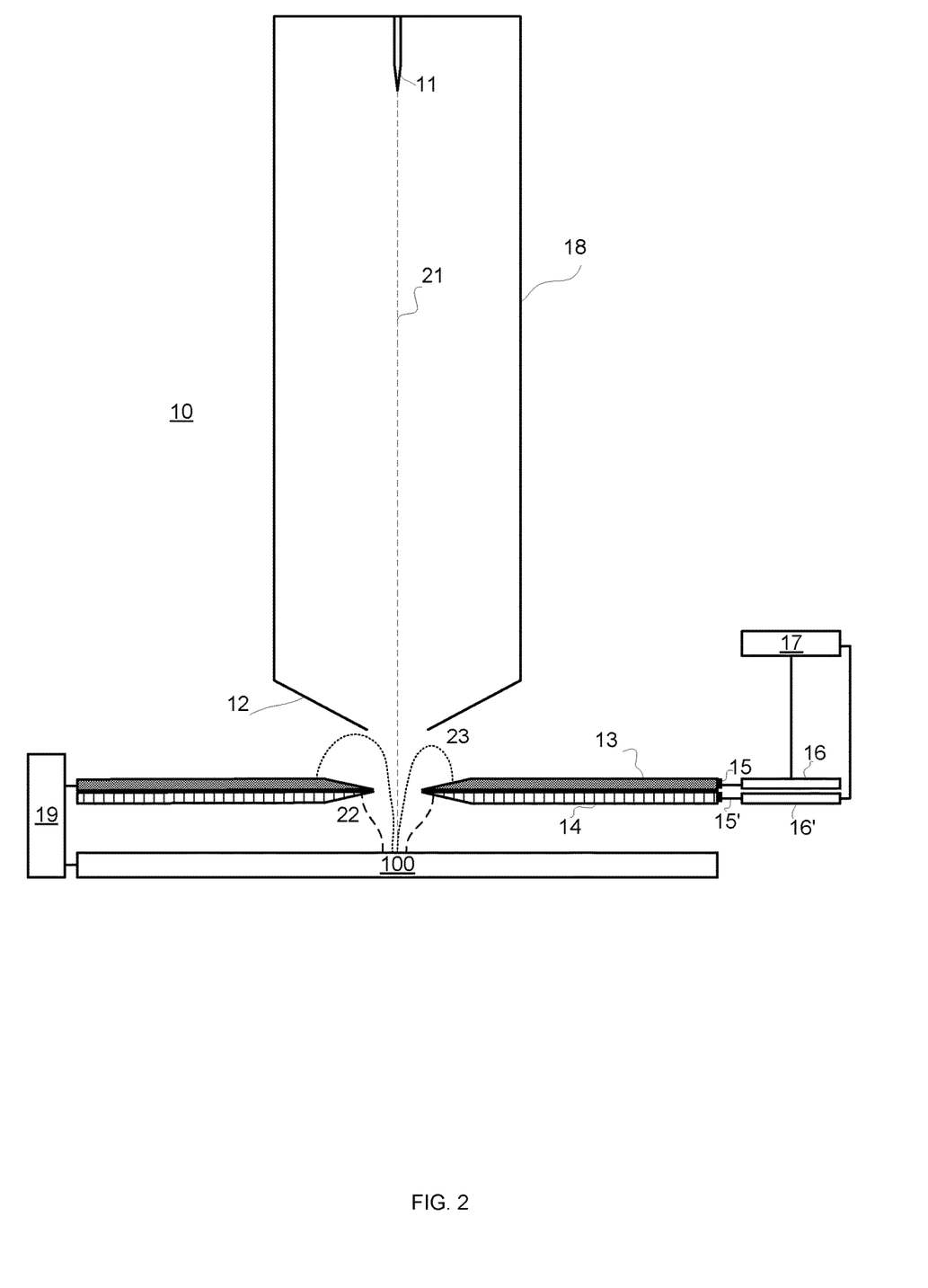
FIG. 2 illustrates an example of a part of a scanning electron microscope (SEM) and a sample.

FIG. 2 illustrates an example of a SEM 10 and a sample 100. The SEM of FIG. 2 differs from the SEM of FIG. 1 by having (instead of a single light guide and a single light detector): a first light detector 16 that is coupled to the first scintillator 13 via a first light guide 15, a second light detector 16' that is coupled to the second scintillator 14 via a second light guide 15'.

Under such configuration the first scintillator and the second scintillator may emit light of the same color—or of different colors.

FIG. 3 illustrates an example of a SEM 10 and a sample 100. The SEM of FIG. 3 differs from the SEM of FIG. 1 by:
a. Independently biasing the first scintillator 13 and the second scintillator 14.
b. Having a splitter 31 that splits the light from the first light guide 15—sending light emitted from the first scintillator (having a first color) to a first light detector 16, and sending light emitted from the second scintillator (having a second color that differs from the first color) to a second light detector 16'.

Figure 4:
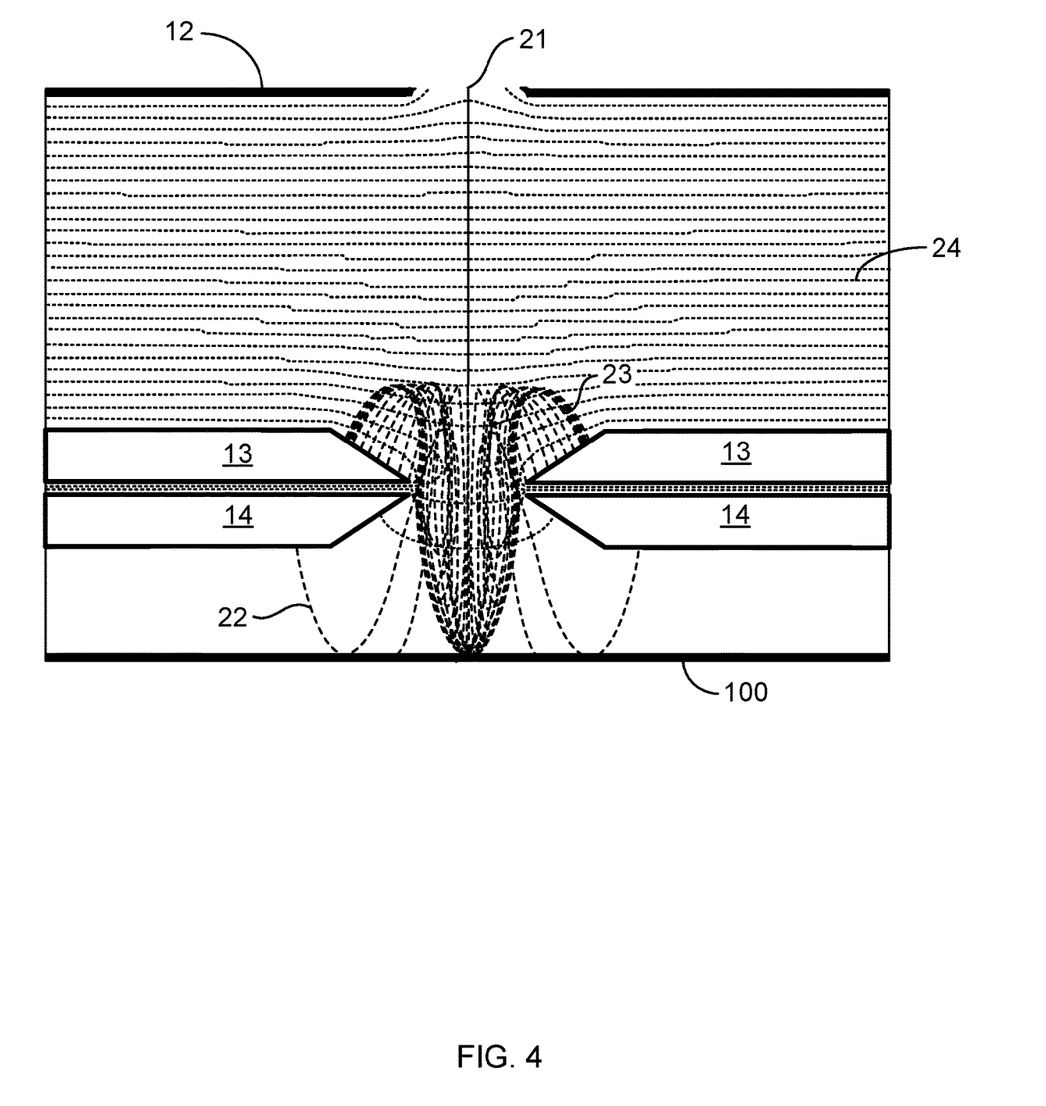
FIG. 4 illustrates an example of a simulation of electrical fields and various electrons and a sample.

FIG. 4 illustrates an example of a simulation of a primary electron beam 21, as of the emission of secondary electrons 23 and backscattered electrons 22 towards the first scintillator 13 and the second scintillator 14, respectively. FIG. 4 also illustrated equipotential lines 24 between the column and the sample 100.

Figure 5:
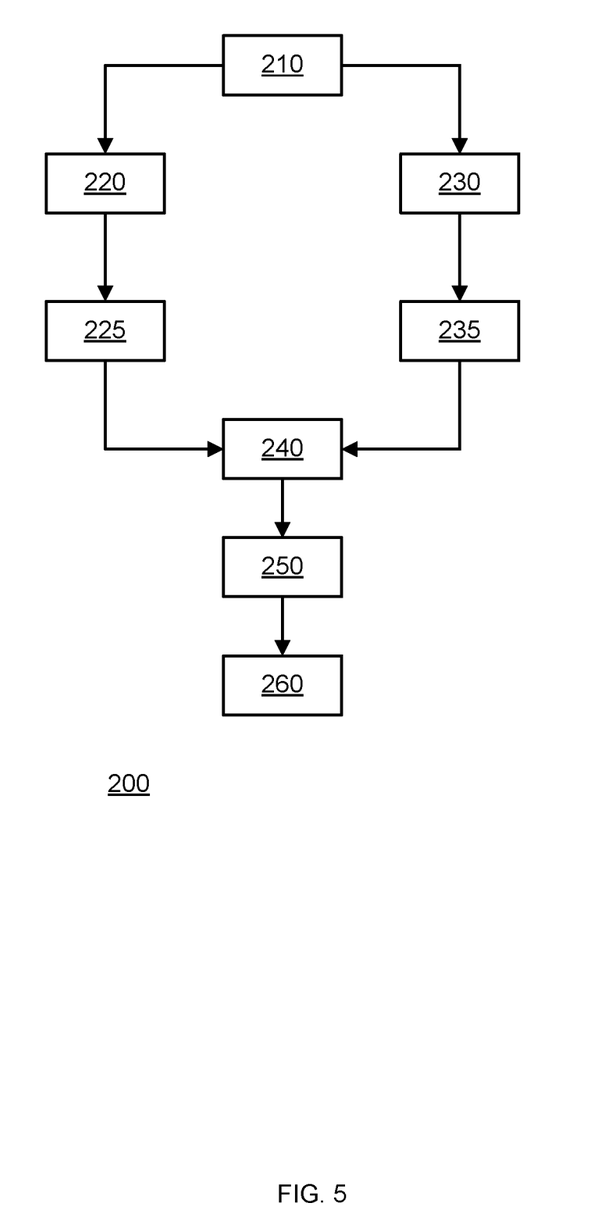
FIG. 5 illustrates an example of a method.

FIG. 5 is an example of a method 200.

Method 200 is executed for evaluating a sample, and especially for generating an overlay image of a region of the sample. The region may include a top layer and a lower layer.

Method 200 may include step 210 of illuminating the sample with a primary electron beam generated by a column of a scanning electron microscope. The term primary merely indicates that the electron beam is used to illuminate the sample.

Step 210 may be followed by step 220 of directing secondary electrons emitted from the sample and propagated above a first scintillator, towards an upper portion of the first scintillator, wherein the first scintillator and a second scintillator are positioned between the sample and a column electrode of the column; wherein the first scintillator is positioned above the second scintillator.

Step 220 may be followed by step 225 of detecting the secondary electrons by the first scintillator. The detecting involves emitting light from the first scintillator.

Step 210 is also followed by step 230 of directing backscattered electrons emitted from the sample towards a lower portion of the second scintillator.

Step 230 may be followed by step 235 of detecting the backscattered electrons by the second scintillator. The detecting involves emitting light from the second scintillator.

Steps 225 and 235 may be followed by step 240 of emitting light from the first scintillator and from the second scintillator towards one or more light detectors and through one or more light guides. Step 240 is executed in a manner that allows to differentiate between the light emitted from the first scintillator and light emitted from the second scintillator.

Step 240 may include emitting, by the first scintillator, light of a first color in response to the detecting of the secondary electrons, and emitting, by the second scintillator, light of a second color that differs from the first color in response to the detecting of the backscattered electrons.

Step 240 may include conveying light emitted from the first scintillator to a first light detector over a first light guide; and conveying light emitted from the second scintillator to a second light detector over a second light guide.

Step 240 may be followed by step 250 of generating detection signals by the one or more light detectors and sending the detection signals (usually electronic signal) to an image processor).

Step 250 may be followed by step 260 of generating, by the image processor, an overlay image of the region illuminated (for example—by scanning the region) by the primary electron beam. The region may be of micron scale length and width—but may be of other scales, The overlay image may be generated after the region is scanned by the SEM. This may require one or multiple repetitions of steps 210, 220, 225, 230, 235, 240 and 250.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A scanning electron microscope, comprising: a column that is configured to illuminate a sample with a primary electron beam; a column electrode; a first scintillator; a second scintillator that is positioned below the first scintillator; a high power supply system; wherein the first scintillator and the second scintillator are positioned between the column electrode and the sample; wherein the high power supply system is configured to bias the sample, the column electrode, the first scintillator and the second scintillator; wherein the first scintillator is configured to detect secondary electrons that were emitted from the sample, propagated above the first scintillator and returned towards the first scintillator; wherein the second scintillator is configured to detect backscattered electrons that were emitted from the sample.

2. The scanning electron microscope according to claim 1 wherein the first scintillator is configured to emit light of a first color in response to the detection of the secondary electrons; and wherein the second scintillator is configured to emit light of a second color that differs from the first color in response to the detection of the backscattered electrons.

3. The scanning electron microscope according to claim 2 comprising a light detector that is coupled to the first and second scintillator via a single light guide.

4. The scanning electron microscope according to claim 1 comprising a first light detector that is coupled to the first scintillator via a first light guide and a second light detector that is coupled to the second scintillator via a second light guide.

5. The scanning electron microscope according to claim 1 comprising at least one light detector, at least one light guide that is coupled between the first scintillator, the second scintillator and the at least one light detector, and an image processor that is coupled to the at least one light detector.

6. The scanning electron microscope according to claim 5 wherein the image processor is configured to generate an overlay image based on signals generated by the at least one light detector.

7. The scanning electron microscope according to claim 1 wherein the first scintillator comprises a first aperture, wherein the second scintillator comprises a second aperture; wherein the column is configured to direct the primary electron beam through the first aperture and through the second aperture; wherein the first scintillator is configured to detect the secondary electrons that passed through the first aperture and through the second aperture.

8. The scanning electron microscope according to claim 1 wherein the high power supply system is configured to positively bias the sample, to positively bias the first scintillator and the second scintillator in relation to the sample, and to negatively bias the column electrode in relation to the first and second scintillator.

9. The scanning electron microscope according to claim 1 wherein the high power supply system is configured to positively bias the sample by a voltage that exceeds ten kilovolts, to bias the first scintillator and the second scintillator by a voltage that exceeds fifteen kilovolts.

10. The scanning electron microscope according to claim 1 wherein a distance between the column electrode and the first scintillator is of a millimetric scale and wherein a distance between the second scintillator and the sample is of a millimetric scale.

11. A method for overlay monitoring, the method comprises:
illuminating a sample with a primary electron beam generated by a column of a scanning electron microscope;
directing secondary electrons emitted from the sample and propagated above a first scintillator, towards an upper portion of the first scintillator, wherein the first scintillator and a second scintillator are positioned between the sample and a column electrode of the column; wherein the first scintillator is positioned above the second scintillator;
detecting the secondary electrons by the first scintillator;
directing backscattered electrons emitted from the sample towards a lower portion of the second scintillator; and
detecting the backscattered electrons by the second scintillator.

12. The method according to claim 11 comprising:
emitting, by the first scintillator, light of a first color in response to the detecting of the secondary electrons; and emitting, by the second scintillator, light of a second color that differs from the first color in response to the detecting of the backscattered electrons.

13. The method according to claim 12 comprising conveying the light of the first color and the light of the second color to a light detector over a single light guide.

14. The method according to claim 11 comprising conveying light emitted from the first scintillator to a first light detector over a first light guide; and
conveying light emitted from the second scintillator to a second light detector over a second light guide.

15. The method according to claim 11 comprising:
conveying detection signals to an image processor; wherein the detection signals are generated by at least one light detector that is coupled by at least one light guide to the first scintillator and to the second scintillator.

16. The method according to claim 15 comprising generating, by the image processor, an overlay image based on the detection signals generated by the at least one light detector.

17. The method according to claim 11 wherein the illuminating comprises directed the primary electron beam through a first aperture formed in the first scintillator, and through a second aperture formed in the second scintillator; and wherein the directing of the secondary electrons comprise directing the secondary electrons through the first aperture through the second aperture.

18. The method according to claim 11 comprising (a) positively biasing, by a high power supply system, the sample, (b) positively biasing, by the high power supply system, the first scintillator and the second scintillator in relation to the sample, and (c) negatively biasing, by the high power supply system, the column electrode in relation to the first and second scintillator.

19. The method according to claim 11 comprising (a) positively biasing, by a high power supply system, the sample by a voltage that exceeds ten kilovolts, (b) biasing, by the high power supply system, the first scintillator and the second scintillator by a voltage that exceeds fifteen kilovolts.

20. The method according to claim 11 wherein a distance between the column electrode and the first scintillator is of a millimetric scale and wherein a distance between the second scintillator and the sample is of a millimetric scale.

* * * * *